US009349440B1

(12) United States Patent
Ma

(10) Patent No.: US 9,349,440 B1
(45) Date of Patent: May 24, 2016

(54) NON-VOLATILE SRAM WITH MULTIPLE STORAGE STATES

(71) Applicant: Empire Technology Development LLC, Wilmington, DE (US)

(72) Inventor: Yanjun Ma, Bellevue, WA (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 0 days.

(21) Appl. No.: 14/567,414

(22) Filed: Dec. 11, 2014

(51) Int. Cl.
- *G11C 11/00* (2006.01)
- *G11C 11/56* (2006.01)
- *G11C 11/413* (2006.01)
- *G11C 13/00* (2006.01)

(52) U.S. Cl.
CPC .............. *G11C 11/56* (2013.01); *G11C 11/413* (2013.01); *G11C 11/565* (2013.01); *G11C 11/5607* (2013.01); *G11C 11/5614* (2013.01); *G11C 11/5678* (2013.01); *G11C 13/004* (2013.01); *G11C 13/0004* (2013.01); *G11C 13/0007* (2013.01); *G11C 13/0069* (2013.01); *G11C 13/0011* (2013.01)

(58) Field of Classification Search
CPC ........... G11C 13/0069; G11C 13/0004; G11C 13/0007; G11C 13/004; G11C 13/0011
USPC ....................... 365/148, 100, 189.011, 189.16
See application file for complete search history.

(56) References Cited

U.S. PATENT DOCUMENTS

| | | | |
|---|---|---|---|
| 5,477,494 A | 12/1995 | Miyagawa et al. | |
| 5,768,188 A | 6/1998 | Park et al. | |
| 6,067,248 A | 5/2000 | Yoo | |
| 6,483,744 B2 | 11/2002 | Kim et al. | |
| 6,710,465 B2 | 3/2004 | Song et al. | |
| 7,206,220 B2 | 4/2007 | Ditewig et al. | |
| 7,266,010 B2 | 9/2007 | King | |
| 7,602,632 B2* | 10/2009 | Breitwisch | G11C 11/16 365/148 |
| 7,692,954 B2 | 4/2010 | Lamorey | |
| 8,064,256 B2* | 11/2011 | Norman | G11C 8/16 365/185.05 |
| 8,194,438 B2 | 6/2012 | Ahn et al. | |
| 8,295,073 B2* | 10/2012 | Norman | G11C 7/1075 365/148 |
| 8,331,134 B2* | 12/2012 | Chiu | G11C 13/0002 365/154 |
| 8,508,983 B2 | 8/2013 | Wang et al. | |
| 8,638,598 B1* | 1/2014 | Lam | G11C 11/56 365/148 |
| 9,042,157 B2* | 5/2015 | Guillemenet | G11C 11/16 365/148 |

FOREIGN PATENT DOCUMENTS

WO     2012098195 A1     7/2012

OTHER PUBLICATIONS

Yu, W.-K. S., et al., "SRAM-DRAM Hybrid Memory with Applications to Efficient Register Files in Fine-Grained Multi-Threading," ISCA, pp. 247-258 (Jun. 2011).

(Continued)

*Primary Examiner* — Pho M Luu
(74) *Attorney, Agent, or Firm* — Turk IP Law, LLC

(57) ABSTRACT

Technologies are generally described herein for a non-volatile static random access memory device with multiple storage states. The multi-storage state non-volatile random access memory device has two or more memory cells. Each memory cell may include one or more programmable resistive devices that may be dynamically programmed to configure the memory cell in a particular logic state.

33 Claims, 8 Drawing Sheets

(56) References Cited

OTHER PUBLICATIONS

"Nonvolatile Products," Cypress Perform, accessed at: http://web.archive.org/web/20131023124509/http://www.cypress.com/?id=65&tabID=72663, accessed on Dec. 15, 2015, p. 1.

"nvSRAM," accessed at http://web.archive.org/web/20141104190011/http://en.wikipedia.org/wiki/NvSRAM last modified on Jun. 21, 2013, pp. 3.

"Platform Flash XL High-Density Configuration and Storage Device," XILINX, Aug. 5, 2015, pp. 88.

Augustine, C., "Spin-Transfer Torque MRAMs for low power memories: Perspective and Prospective," IEEE Sensors Journal, vol. 12, Issue 4, pp. 756-766 (Mar. 10, 2011).

Chen, C.F., et al., "A 210mV 7.3MHz 8T SRAM with Dual Data-Aware Write-Assists and Negative Read Wordline for High Cell-Stability, Speed and Area-Efficiency," Symposium on VLSI Circuits Digest of Technical Papers, pp. C130-C131 (Jun. 11-13, 2013).

Chen, E., et al., "Advances and future prospects of spin-transfer torque random access memory," IEEE Transactions on Magnetics, vol. 46, Issue 6, pp. 1873-1878 (Jun. 2010).

Chen, G.K., et al, "Yield-driven near-threshold SRAM design," IEEE Transaction on Very Large Scale Integration (VLSI) Systems, vol. 18, Issue 11, pp. 1590-1598 (Sep. 15, 2009).

Dreslinski, R.G., et al., "Near-Threshold Computing: Reclaiming Moore's Law Through Energy Efficient Integrated Circuits," Proceedings of the IEEE, vol. 98, Issue 2, pp. 253-266 (Feb. 2010).

Hussien J., and Patel, R., "MultiBoot with Virtex-5 FPGAs and Platform Flash XL," Nov. 6, 2008, pp. 13.

International Search Report and Written Opinion for International Application No. PCT/US2013/073596 mailed May 21, 2014.

Katine, J.A., and Fullerton, E.E., "Device implications of spin-transfer torques," Journal of Magnetism and Magnetic Materials, vol. 320, Issue 7, pp. 1217-1226 (Apr. 2008).

Kulkarni, J., et al., "Dual-VCC 8T-bitcell SRAM Array in 22nm Tri-Gate CMOS for Energy-Efficient Operation across Wide Dynamic Voltage Range," IEEE Symposium on VLSI Circuits Digest of Technical Papers, pp. C126-C127 (Jun. 12-14, 2013).

* cited by examiner

NON-VOLATILE SRAM WITH MULTIPLE STORAGE STATES

BACKGROUND

Unless otherwise indicated herein, the materials described in this section are not prior art to the claims in this application and are not admitted to be prior art by inclusion in this section.

Static random-access memory (SRAM) is a semiconductor memory device that uses various mechanisms to store a state. For example, an SRAM can store a logic low, or "0," state in one configuration and a logic high, or "1," state in another configuration. An SRAM may be utilized in computer design because of its relatively low power consumption, speed, and simple operation. One application of an SRAM is as a configuration memory for a field-programmable gate array (FPGA). Other non-volatile FPGAs may use flash memories to store configuration data. SRAMs may typically be more expensive and less dense than dynamic random-access memory (DRAM). Thus, the use of SRAMs can be limited based on size and cost considerations.

SUMMARY

Briefly stated, technologies are generally described herein for a non-volatile static random-access memory (nvSRAM) device with multiple storage states. In some examples, the multi-storage state non-volatile static random access memory device may have two or more memory cells. Each memory cell may include one or more programmable resistive devices having resistance values that may be dynamically programmed during a write operation to configure the memory cell to a particular logic state. During a read operation, the resistance value of the particular pair of programmable resistive devices may be sensed as an indication of the logic state of the memory cell.

In one configuration, a multi-storage state non-volatile random access memory device is described. The multi-bit non-volatile random access memory device may include a first node, a first multi-bit storage circuit, a second multi-bit circuit, a reference circuit and a write enable circuit. The first multi-bit circuit may include a first transistor and a first programmable resistive device. The first terminal of the first transistor may be coupled to a second node, a control terminal of the first transistor coupled to a first write line, and a second terminal of the first transistor coupled to a third node. The first programmable resistive device may be coupled between the third node and a first bit line. A second multi-bit storage circuit may include a second transistor and a second programmable resistive device. The first terminal of the second transistor may be coupled to the second node, a control terminal of the second transistor coupled to a second write line, and a second terminal of the second transistor coupled to a fourth node. The second programmable resistive device may be coupled between the fourth node and the first bit line. The reference circuit may include a third transistor. The first terminal of the third transistor coupled to a second bit line, a second terminal of the third transistor coupled to the first node, and a control terminal of the third transistor coupled to a common write line. The write enable circuit may include a fourth transistor having a first terminal coupled to the first node, a second terminal coupled to the second node, and a control terminal coupled to a write enable line. The write enable circuit may be configured to activate in response to a write enable signal on the write enable line such that current flows either from the first bit line to the second bit line, or from the second bit line to the first bit line. A logic high state or a logic low state in may be stored in one or more of the first multi-bit storage circuit or the second multi-bit storage circuit.

In another configuration, a multi-bit non-volatile static random access memory device is described. The multi-bit non-volatile static random access memory device may include a write enable circuit, a common resistive circuit and a plurality of multi-bit storage circuits. The write enable circuit may be coupled to a first node and a second node, and an input terminal of the write enable circuit may be coupled a write enable line. The common resistive circuit may be coupled to a first bit line and to the first node. The plurality of multi-bit storage circuits may each include a first transistor that includes a first terminal coupled to the second node, a second terminal coupled to a first programmable resistive device, and a control terminal coupled to a write line. The first programmable resistive device may be coupled between the second terminal and a second bit line. A relative resistance value between the first programmable resistive device and the common resistive circuit may represent a value of a binary bit stored by one or more of the multi-bit storage circuits.

In yet another configuration, a multi-bit non-volatile random access memory device is described. The multi-bit non-volatile random access memory device may include a cross coupled inverter pair, a first series transistor-resistor pair, a second series transistor-resistor pair and a write circuit. The cross coupled inverter pair may be coupled between a first node and a second node. The first series transistor-resistor pair may include a first transistor coupled in series with a first resistive device. The first series transistor-resistor pair may be coupled between the first node and a first bit line and a control terminal of the first transistor coupled to a first word line. The second series transistor-resistor pair may include a second transistor coupled in series with a second resistive device. The second series transistor-resistor pair may be coupled between the second node and a second bit line and the control terminal of the second transistor may be coupled to a second word line. A write circuit may include a third transistor coupled between the first node and the first bit line and a fourth transistor coupled between the second node and the second bit line. The control terminals of the third transistor and the fourth transistor may be coupled to a write enable word line. The write circuit may be configured to activate to write a logic state to the memory device. The logic state may be represented by a differential resistance between the first series coupled transistor-resistor pairs and the second series coupled transistor-resistor pair.

In still yet another configuration a method operating a multi-bit non-volatile random access memory device is described. The method may include asserting a first signal to a first transistor to enable a current path between a first terminal of a first transistor and a first terminal of a second transistor. A second signal may be asserted to the first transistor and the second transistor to activate the first transistor and the second transistor. A voltage may be asserted to a first bit or a second bit line. Asserting the voltage to a first bit line may cause current flow from the first bit line through a first programmable resistive device, the first transistor, the second transistor, a second resistive device and out to a second bit line to store a first logic state. Asserting the voltage to the second bit line may case cause current flow from the second bit line through the second resistive device, the second transistor, the first transistor, the first programmable resistive device and out to the first bit line to store a second logic state.

In yet another configuration, a method to program an anti-fuse multi-bit non-volatile SRAM device is described. The method may include writing desired data into the SRAM device to make the inverter node that couples to the selected antifuse to a low voltage state. A wordline transistor of a selected antifuse may be activated and a programming voltage may be asserted to a first bit line to cause the selected antifuse to breakdown in a manner that reduces a resistance value of the selected antifuse.

In still yet another configuration, a multi-bit non-volatile static random access memory device is described. The device may include a cross coupled inverter pair coupled between a first node and a second node. A plurality of first transistor-resistor pairs may be coupled in series between the first node and a third node and coupled to a respective first word line. The third node may be coupled to a supply line through an enable transistor. A plurality of second transistor-resistor pairs may be coupled in series between the second node and the third node and coupled to a respective second word line. A first write transistor may be coupled between the first node and a first bitline, and a first control terminal coupled to a write enable word line. A second write transistor may be coupled between the second node and a second bitline, and a second control terminal coupled to the write enable word line. One or more of the first write transistor or the second write transistor can be activated to write a logic state to the memory device, the logic state represented by a differential resistance between at least one of the first series coupled transistor-resistor pairs and at least one of the second series coupled transistor-resistor pairs.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
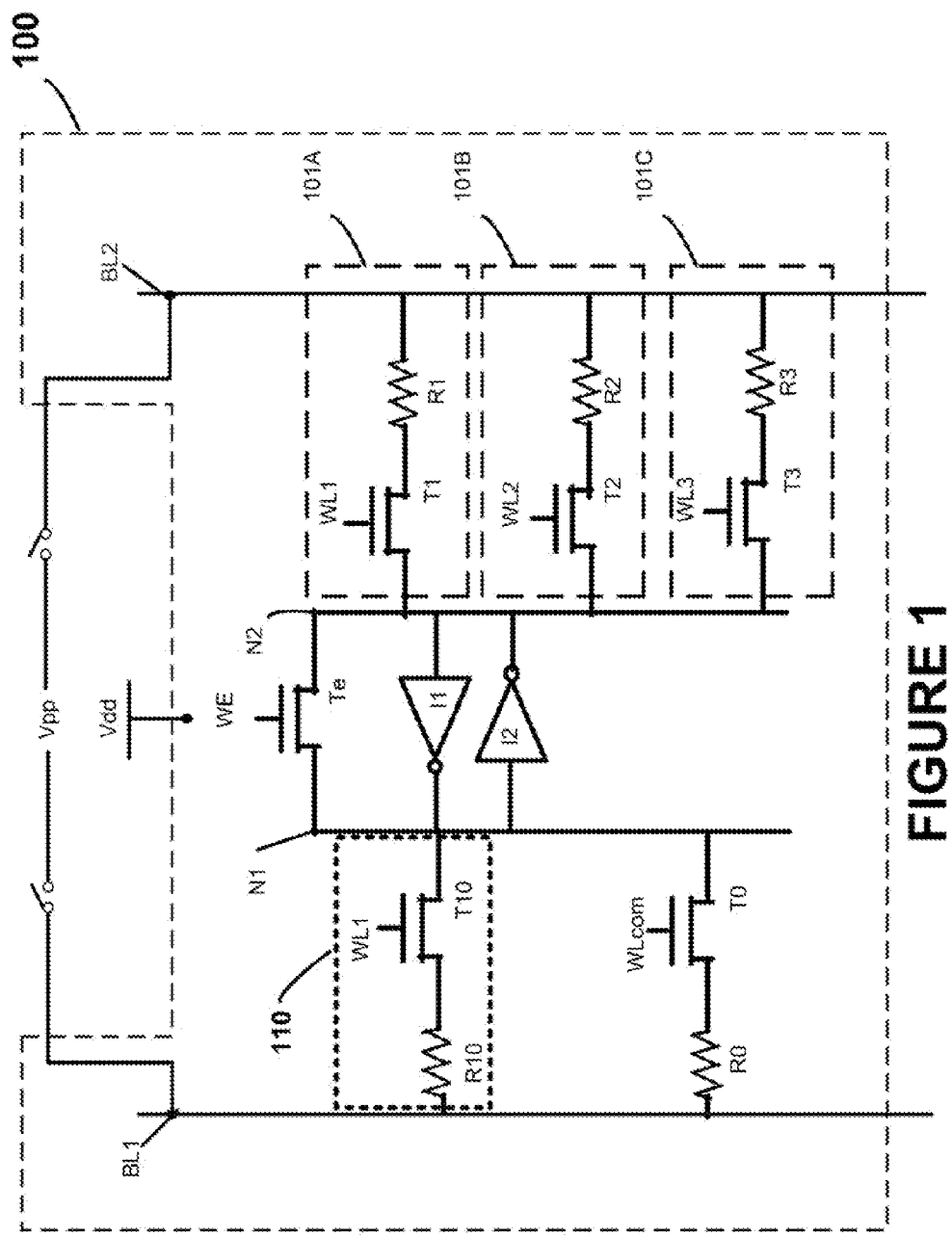
FIG. 1 is a schematic circuit diagram illustrating an example multi-storage state nvSRAM device.

In the following detailed description, reference is made to the accompanying drawings, which form a part hereof. In the drawings, similar symbols typically identify similar components, unless context dictates otherwise. The illustrative embodiments described in the detailed description and drawings are not meant to be limiting. Other embodiments may be utilized, and other changes may be made, without departing from the spirit or scope of the subject matter presented herein. The aspects of the present disclosure, as generally described herein, and illustrated in the figures, can be arranged, substituted, combined, separated, and designed in a wide variety of different configurations, all of which are explicitly contemplated herein.

This disclosure is generally drawn, inter alia, to technologies for a multi-storage state nvSRAM which has a plurality of storage circuits (e.g., "memory cells"). In some embodiments, the memory cells in the multi-storage state nvSRAM may have the same logic state or different logic states. For example, a memory cell in the multi-storage state nvSRAM may have programmed therein one programmable resistive device with a high resistive state corresponding to a first logic value (e.g., logic high "1") and another programmable resistive device with a low resistive state corresponding to a second logic value (e.g., logic low "0"), and variations thereof. Example logic values for the first and second logic values may correspond to high/high, low/low, high/low, and low/high combination of the resistive values. The terms "low" and "high" may be used in a relative sense and do not connote, and are not intended to specify, any particular measurement or degree.

In some additional configurations, memory cells in the multi-storage state nvSRAM may have two or more storage states depending on the number of programmable resistive devices (such as programmable resistors or programmable non-volatile memory transistors) that are used. As used herein, a "storage state" may be used in reference to the logic state of a memory cell in the nvSRAM. The term "storage state" as used herein generally is not an operational (or active) state of an nvSRAM device or one or more of nvSRAM cells, such as "standby," "sensing," and "writing."

FIG. 1 is a schematic circuit diagram illustrating an example multi-storage state nvSRAM device 100 that is arranged in accordance with at least some embodiments described herein. The nvSRAM device 100 may have a plurality of storage circuits, identified as a storage circuit 101A, a storage circuit 101B and storage circuit 101C (and which may be generically referred to herein as "storage circuit[s] 101"). Each of the storage circuits 101 may provide at least two storage or logic states. The circuit illustrated in dashed line 110 may also be a storage circuit 101. Although FIG. 1 describes three different storage circuits, more or less storage circuits may be used according to various configurations described herein.

As illustrated, the nvSRAM device 100 may include transistors T1, T2, T3, T0, and T10, inverters I1 and I2, and resistive devices R1, R2, R3, R0, and R10. Inverter I1 may include an input terminal coupled to a node N2 and an output terminal coupled to a node N1. Inverter I2 may include an input terminal coupled to node N1 and an output coupled to node N2.

Transistor T1 may include a first terminal coupled to node N2, a second terminal coupled to resistive device R1, and a control terminal coupled to a first write line WL1. Transistor T2 may include a first terminal coupled to node N2, a second terminal coupled to resistive device R2, and a control terminal coupled to a second write line WL2. Transistor T3 may include a first terminal coupled to node N2, a second terminal coupled to resistive device R3, and a control terminal coupled to a third write line WL3. Transistor T10 may include a first terminal coupled to resistive device R10, a second terminal coupled to node N1, and a control terminal coupled to the first write line WL1. Transistor Te may include a first terminal coupled to node N1, a second terminal coupled to node N2, and a control terminal coupled to a write enable line WE. Transistor T0 may include a first terminal coupled to resistive device R0, a second terminal coupled to node N1, and a control terminal coupled to a common write line WLcom.

As illustrated in FIG. 1, resistive device R1 may be coupled in series between transistor T1 and bit line BL2. Resistive device R2 may be coupled in series between transistor T2 and bit line BL2. Resistive device R3 may be coupled in series between transistor T3 and bit line BL2. Resistive device R10 may be coupled between transistor T10 and bit line BL1. Resistive device R0 may be coupled between transistor T0 and bit line BL1.

The nvSRAM device 100 may be powered by a supply voltage Vdd. According to some examples, the logic state of an SRAM cell may be represented by a difference in the voltages of node N1 and N2. For example, when N1 is at the ground voltage, N2 may be at the supply voltage Vdd due at least in part by the actions of the cross coupled inverters I1 and I2. This state may be designated as a logic state "0" of an SRAM cell, which may be referred to herein as a logic low state. Conversely when N1 is at Vdd, N2 may be ground, and this state may be designated as a logic "1" state which may be referred to herein as a logic high state.

For the sake of simplicity of explanation herein, inversion circuitry will be generally described in the context of various inverters. Other types of inversion circuitry configured to provide inversion capability may be used, alternatively or additionally to inverters. Such other types of inversion circuitry may include, for example, inversion logic configurations and logic gates (NAND, NOR, AND, OR etc. suitably coupled to provide inversion), analog and/or digital inversion circuits, transformers, flip-flops, bistable latches, and/or others.

Various types of transistors may also be used. The following disclosure may use, for purposes of illustration, metal-oxide semiconductor field effect transistors (MOSFET). A MOSFET may have a source terminal (e.g., a first terminal), a drain terminal (e.g., a second terminal), and a control terminal. When an appropriate level of bias signal is applied to the control terminal, the transistor may be activated (e.g., biased into active operation) wherein conduction between the source terminal and the drain terminal may be facilitated. Depending on the type of transistor (e.g., N-type or P-type), an appropriate level of bias signal may be applied, or previously applied bias signal may be removed, to cause the transistor to be deactivated wherein conduction between the source and the drain may be abated. A MOSFET "terminal" may also be termed a "port."

The following description describes one or more examples of the storing of logic states in the nvSRAM device 100, in accordance with various configurations. The resistive devices (e.g., R0, R10, R1, R2, or R3) may be of fixed value or programmable type of resistors or a mixture thereof. According to some examples, the resistive devices, R1, R2, R3 and R10 may include magnetic tunnel junction (MTJ) programmable resistors, and resistive device R0 may include a fixed value resistor with a resistance value between that of a low resistance state ("LRS") and a high resistance state ("HRS"). In other configurations, the resistive devices may include one or more programmable non-volatile memory transistors that can be programmable to at least two resistance states (e.g., a LRS and a HRS). The characteristic of a MTJ programmable resistor may be such that when a current that exceeds a critical current density is passed through the MTJ programmable resistor in one direction, the MTJ programmable resistor may be in a LRS.

If a current is passed in the opposite direction, the MTJ programmable resistor may turn from a LRS to a HRS. The use of a magnetic tunnel junction resistor is for purposes of illustration only, and other types of programmable resistive devices may be used. The resistive devices may also be based on a conductive-bridge resistor, a metal-oxide bipolar filament, a metal-oxide bipolar interface effect, or an amorphous silicon switching medium. Other resistive devices may be used, including those that can be placed into a high resistance state or a low resistance state depending upon the voltage polarity and magnitude applied across two nodes. In some configurations, a relative resistance value between a first programmable resistive device and a second programmable resistive device may be used to store a binary bit.

The resistance value of the MTJ programmable resistors may depend, in part, on the relative magnetization direction of a first ferromagnetic layer to a second ferromagnetic layer, as well as the magnetic and physical properties of the layers themselves. If the resistors are implement technology based on a spin transfer torque (STT) magnetic tunnel junction resistor, a current may be introduced to control the magnetization direction of a free layer. The direction of magnetization may be controlled and switched via spin exchange between the electrons in the driving current and the electrons in the free layer. In some configurations, the use of a current may not involve the application of an external magnetic field. Any suitable method of introducing a spin-polarization current or applying a spin torque may be implemented in various embodiments. For example, spin torque may be applied using an external magnetic field in magnetic communication with the magnetic field of the first ferromagnetic layer. The programmable characteristics may be used in the nvSRAM device 100 to store multiple states and to change those states.

According to some configurations, the following illustrative procedure may be performed to store a logic "1" state in a memory cell of the nvSRAM device 100. For example, to store a "1" in the storage circuit 101A, the following procedure may be utilized. First, the write enable line WE and the write line WL1 may be enabled, thereby activating transistors Te, T1 and T10. Next, bit line BL2 may be brought to ground and bit line BL1 may be brought to a high voltage Vpp. In some examples, voltage Vpp may be higher during normal operations as compared to the power supply voltage Vdd. In response to bit line BL2 being brought to ground and bit line BL1 being brought to voltage Vpp, current may flow from bit line BL1 to bit line BL2. Based on the direction of the current flow, resistive device R10 may be turned to a HRS and resistive device R1 may be turned to a LRS. A logic "1" state may thereby be stored in resistive devices R1 and R10 (e.g., non-volatile storage elements) as represented by their differential resistance value in the LRS and HRS state, respectively.

To store a "0" state within a non-volatile storage element (e.g., a resistive device), a similar procedure may be used to as used to store the logic high state. To store a logic low state (e.g., "0"), bit line BL1 may be brought to ground and bit line BL2 may be brought to voltage Vpp. In this example, current may flow in the opposite direction as compared to the procedure used to store the logic high state. When the current flows in the opposite direction as compared to the procedure used to store the logic high state, resistive device R10 becomes a LRS and resistive device R1 becomes a HRS.

A similar procedure may be used to store a logic low state or a logic high state in the other storage circuits (e.g., storage circuit 101B or 101C). For example, instead of activating write line WL1, write line WL2 may be activated or write line WL3 may be activated. In both cases, write line WLcom may be also activated to allow current to flow between bit line BL1 and bit line BL2. In some configurations, a logic state may be stored in different memory cells during the same procedure. For example, two or more write lines (e.g., write lines WL1, WL2, or WL3) may be activated in parallel.

In some configurations, the resistive device R0 may have a fixed resistance value between the resistance values of the LRS and the HRS. For example, current may be configured to flow from bit line BL2 to bit line BL1 by turning on transistors T0, Te, and T2 to turn resistive device R2 to a HRS. The differential resistance pair that comprises resistive devices R2 and R0 (with resistance values R2>R0) may be configured to store a state that can be turned into a "0" state for the SRAM cell. Similarly, resistive device R3 may be moved to a LRS state. The differential resistance pair comprised of resistive devices R0 and R3, (with resistance values R3<R0), may store a state that can be turned into a "1" state for the SRAM cell.

To restore the nvSRAM device 100 from the stored state (e.g., as represented by resistive devices R10 and R1, or resistive devices R0 and R2, or resistive devices R0 and R3) from a powered off state to a logic high state, bit lines BL1 and BL2 may be set to ground, the respective transistors (e.g., transistors T10 and T1, or transistors T0 and T2, or transistors T0 and T3) associated with the memory cell being restored may be activated, and the power supply to the inverters I1 and I2 may be brought to voltage Vdd. After performing these actions, the voltage at node N1 may be higher than the voltage at node N2 since the path from node N1 to bit line BL1 may have a higher total resistance value than the resistance for the path from node N2 to bit line BL2. Due at least in part to the actions of the cross coupled inverter I1 and I2, when the power is restored to voltage Vdd, node N1 may become near voltage Vdd and node N2 at ground, thereby restoring the SRAM cell to the logic high state (e.g., logic "1" state).

To restore a SRAM cell from the stored state to a logic low state (e.g. as represented by resistive device pair R0 and R2), from a powered off state, bit lines BL1 and BL2 may be kept at ground, transistors T0 and T2 may be activated, and the power supply to the inverters I1 and I2 may be moved to voltage Vdd. After performing these operations, the voltage at node N2 may be higher than the voltage at node N1 since the path from node N2 to bit line BL2 may have a higher total resistance value than that of the path from node N1 to bit line BL1. Due at least in part to the actions of the cross coupled inverters I1 and I2, when the power supply to voltage Vdd is restored, node N2 may move to voltage Vdd and node N1 may move to ground, thereby restoring the respective storage circuit 101 to a logic "0" state.

According to some configurations, the active state of the nvSRAM device 100 may be switched to a stored state without turning off the power to the inverters. For example, the SRAM state may be in a logic high state with node N1 at voltage Vdd and node N2 at ground. To switch to the state stored in the resistive devices R2/R0 (e.g., "0" in the above example), where the resistance value of resistive device R2 is greater than the resistance value of resistive device R0, the following example procedure might be performed. First, the bit lines BL1 and BL2 may be kept at ground. The write enable WE signal may then be activated. Activating the WE signal may equalize the voltage at node N1 and node N2 since transistor Te is turned on (e.g., activated). The word line WLcom and word line WL2 may then be enabled to turn on transistors T0 and T2. At approximately the same time, transistor Te may be turned off by de-activating the write enable signal WE. Based at least in part on the cross coupled inverters I1 and I2, the voltage at node N2 may rapidly reach voltage Vdd while node N1 may be at ground.

According to some examples, the resistance values for the programmable resistive devices may be set to around 20000 ohms in a HRS and set to a value of around 10000 ohms for a LRS. Other resistance values may be utilized. In other configurations (e.g. for that of antifuse), the HRS could have resistance of more than a giga ($10^9$) ohms while LRS could have resistance as little as 10 ohms. Generally, an antifuse may refer to a device that starts with a high resistance and is designed to create an electrically conductive path (e.g., when the voltage across the antifuse exceeds a certain level).

In some examples, the resistive device R0 may include a fixed value resistor having a resistance value in between that of LRS and HRS. The resistive devices may be of other types such as conductive-bridge resistor, metal-oxide bipolar filament resistor, metal-oxide bipolar interface effect resistor, or an amorphous silicon switching medium resistor, or a fuse or antifuse element.

According to some configurations, as illustrated by dashed line 110, the resistive device R10 and transistor T10 may be removed from the nvSRAM device 100. In these examples, a single transistor-resistive device pair coupled to node N1 may used as the reference pair for the programmable resistor-transistor pairs coupled to node N2.

Figure 2:
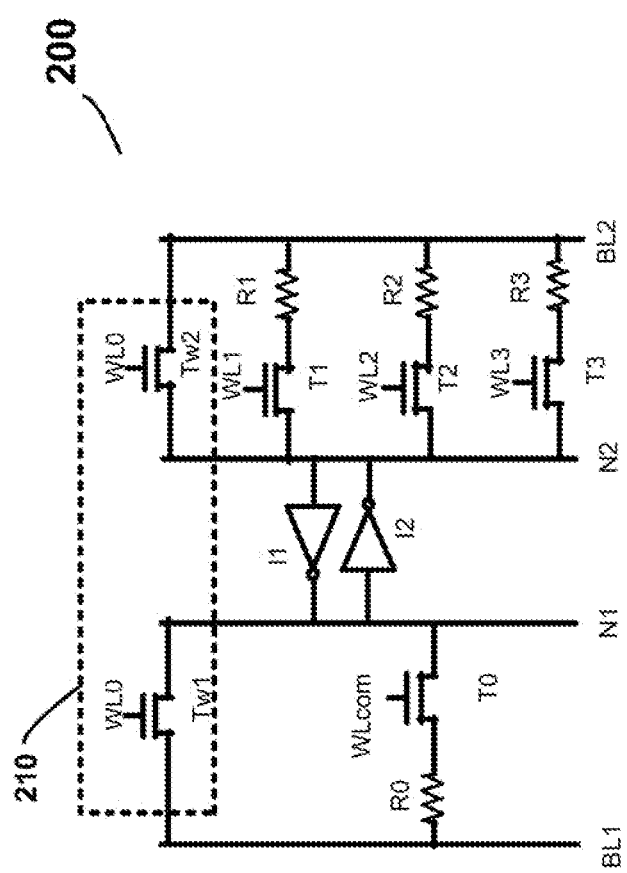
FIG. 2 is a schematic circuit diagram illustrating an example multi-storage state nvSRAM device that removes the write enable transistor.

FIG. 2 is a schematic circuit diagram illustrating an example multi-storage state nvSRAM device 200 that removes the write enable transistor that is arranged in accordance with at least some embodiments described herein. FIG. 2 is a variant of multi-bit non-volatile SRAM device 100 illustrated in FIG. 1. As illustrated, the nvSRAM device 200 may include transistors T0, T1, T2, T3, Tw1 and TW2, inverters I1 and I2, and resistive devices R0, R1, R2, and R3.

Inverter I1 may include an input terminal coupled to node N2 and an output terminal coupled to node N1. Inverter I2 may include an input terminal coupled to node N1 and an output terminal coupled to node N2.

Transistor T1 may include a first terminal coupled to node N2, a second terminal coupled to resistive device R1, and a control terminal coupled to a first write line WL1. Transistor T2 may include a first terminal coupled to node N2, a second terminal coupled to resistive device R2, and a control terminal coupled to a second write line WL2. Transistor T3 may include a first terminal coupled to node N2, a second terminal coupled to resistive device R3, and a control terminal coupled to a third write line WL3. Transistor T10 may include a first terminal coupled to resistive device R10, a second terminal coupled to node N1, and a control terminal coupled to the first write line WL1. Transistor T0 may include a first terminal coupled to resistive device R0, a second terminal coupled to node N1, and a control terminal coupled to a common write line WLcom. Transistor Tw1 may include a first terminal coupled to bit line BL1, a second terminal coupled to node N1, and a control terminal coupled to a write line WL0. Transistor Tw2 may include a first terminal coupled to N1, a second terminal coupled to bit line BL1, and a control terminal coupled to a write line WL0.

As illustrated in FIG. 2, resistive device R1 may be coupled in series between transistor T1 and bit line BL2. Resistive device R2 may be coupled in series between transistor T2 and bit line BL2. Resistive device R3 may be coupled in series between transistor T3 and bit line BL2. Resistive device R10 may be coupled between transistor T10 and bit line BL1. Resistive device R0 may be coupled between transistor T0 and bit line BL1.

Compared to nvSRAM device 100, in the nvSRAM device 200 the write line transistor and resistors pair T10-R10 may be removed. The transistor-resistor pair T10-R10, may be replaced by two write transistors Tw1 and Tw2, whose control terminals may be coupled to a wordline WL0. These two transistors Tw1 and Tw2 may form a write port 210 for the nvSRAM device 200 through which a logic state may be written to an SRAM cell. For example, node N1 can be moved to voltage Vdd while node N2 can be made to be at ground by turning bit line BL1 to voltage Vdd and bit line BL2 to ground and enabling the write wordline WL0.

According to some configurations, the logic state of an SRAM cell may be stored to a resistive device pair (e.g., to the resistive pairs comprised of resistive devices R2 and R0, R1 and R0, or R3 and R0) by the following example procedure. First, the power supply voltage may be brought to a voltage Vpp that may be higher than voltage Vdd. In the above example described in FIG. 1 where the SRAM is in a "1" state, node N1 may be at voltage Vpp and node N2 may be at ground. Both bit lines BL1 and BL2 may be brought to voltage Vpp/2 and word lines WLcom and WL2 may be activated. As a result of these operations, current may flow from node N1 to bit line BL1 and from bit line BL2 to node N2. The direction of current flow through resistive device R2 may be such that the programmable resistive device R2 may change into a LRS, and have a lesser resistance value than the fixed resistive device R0.

To restore the SRAM cell from the stored state (e.g., as represented by the resistive pairs R2 and R0, R1 and R0, or R3 and R0), from a powered off state, both bit lines BL1 and BL2 may be set to ground, the transistors T0 and the associated transistor for the memory cell (e.g., transistors T1, T2, and/or T3) may be activated, and then the inverters (I1 and I2) may be brought to voltage Vdd. Since the path from node N2 to bit line BL2 may have a lower total resistance value than that of the path from node N1 to bit line BL1, the voltage at node N2 may be lower than the voltage at node N1. Based at least in part on the actions of the cross coupled inverters I1 and I2, when the power supply is restored to voltage Vdd, node N1 may be at voltage Vdd and node N2 at ground, thereby restoring the SRAM cell to a logic "1" state.

Figure 3:
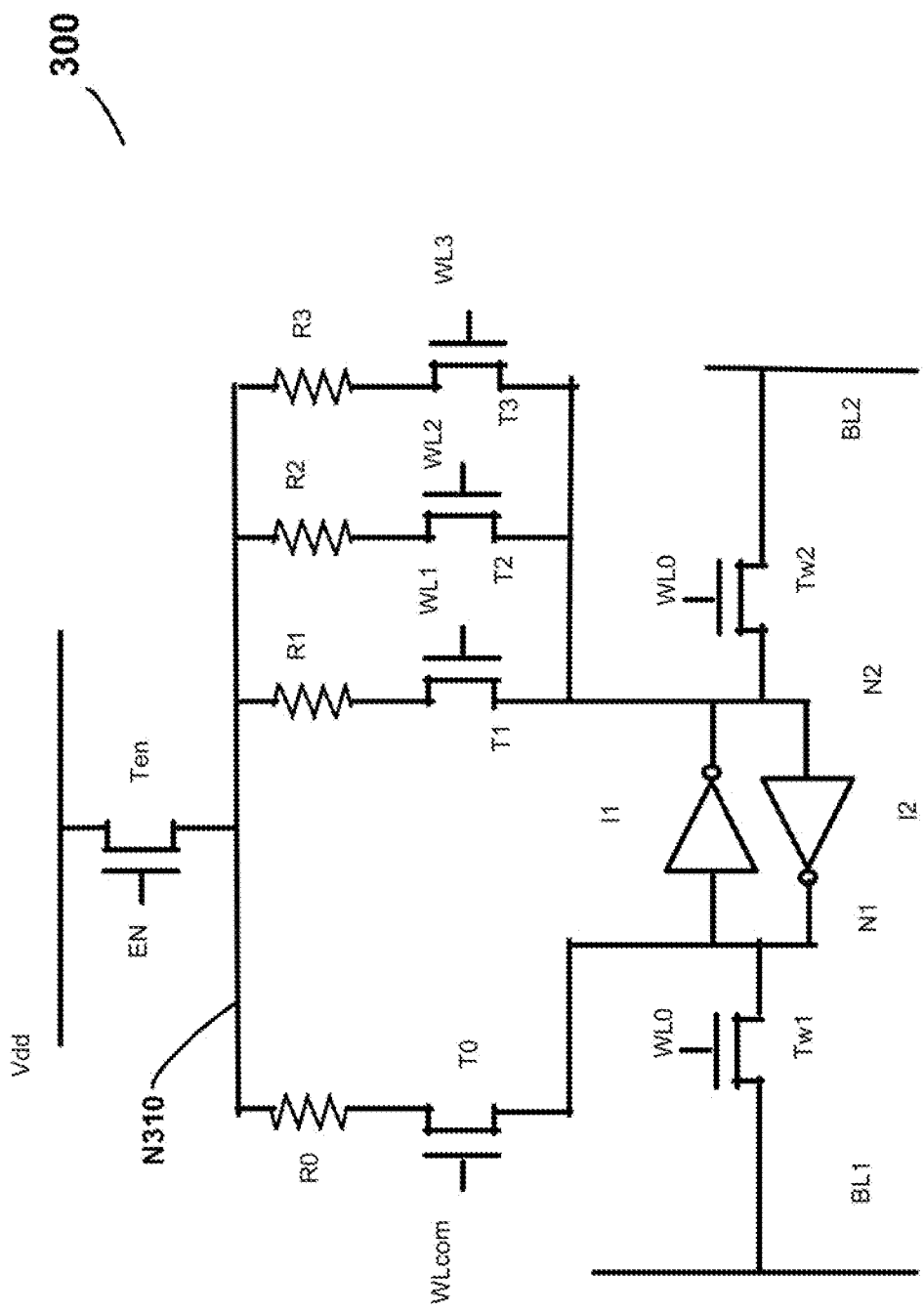
FIG. 3 is a schematic circuit diagram illustrating another example of a multi-storage state nvSRAM device.

FIG. 3 is a schematic circuit diagram illustrating another example of a multi-storage state nvSRAM device 300 that is arranged in accordance with at least some embodiments described herein. As illustrated, the nvSRAM device 300 may include transistors T0, T1, T2, T3, Tw1, Tw2 and Ten, inverters I1 and I2, and resistive devices R0, R1, R2, and R3.

Inverter I1 may include an input terminal coupled to node N1 and an output terminal coupled to node N2. Inverter I2 may include an input terminal coupled to node N2 and an output terminal coupled to node N2.

Transistor T0 may include a first terminal coupled to resistive device R0, a second terminal coupled to node N1, and a control terminal coupled to a common write line WLcom. Transistor T1 may include a first terminal coupled to node N2, a second terminal coupled to resistive device R1, and a control terminal coupled to a first write line WL1. Transistor T2 may include a first terminal coupled to node N2, a second terminal coupled to resistive device R2, and a control terminal coupled to a second write line WL2. Transistor T3 may include a first terminal coupled to node N2, a second terminal coupled to resistive device R3, and a control terminal coupled to a third write line WL3.

Transistor Tw1 may include a first terminal coupled to bit line BL1, a second terminal coupled to node N1, and a control terminal coupled to a write line WL0. Transistor Tw2 may include a first terminal coupled to N2, a second terminal coupled to bit line BL2, and a control terminal coupled to a write line WL0. Transistor Ten may include a first terminal coupled to node N310, a second terminal coupled to Vdd, and a control terminal coupled to an enable line EN.

As illustrated in FIG. 3, resistive device R1 may be coupled in series between transistor T1 and node N310. Resistive device R2 may be coupled in series between transistor T2 node N310. Resistive device R3 may be coupled in series between transistor T3 and node N310. Resistive device R0 may be coupled between transistor T0 and node N310.

As illustrated, the nvSRAM device 300 may comprise three non-volatile storage elements formed by transistor-resistive device pairs T1 and R1, T2 and R2, and T3 and R3. The reference circuit, transistor-resistor pair T0-R0, may be coupled between node N1 and voltage Vdd through transistor Ten.

The transistors Tw1 and Tw2 may be configured to form a write port for the SRAM cell through which a logic state can be written to the SRAM cell. For example node N1 can be written to voltage Vdd while node N2 may be made to be at ground by turning bit line BL1 to voltage Vdd and bit line BL2 to ground and enabling the write word line WL0. As previously discussed, the resistive devices R1, R2, R3 may be of a programmable type, e.g. non-volatile memory transistors such as a floating gate transistor or a charge trapping transistor, MTJ resistors, resistive oxide memory type of resistors, or a fuse or antifuse element (and/or other resistor device types), that can have at least two possible resistance values, a HRS and a LRS. In some examples, fixed value resistive device R0 may be chosen to have a resistance value that is between the HRS and LRS values.

Figure 4:
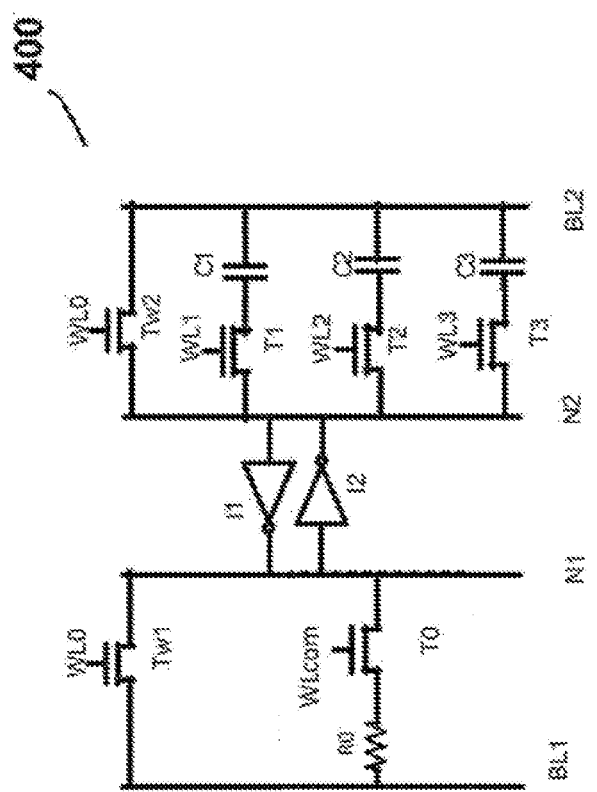
FIG. 4 is a schematic circuit diagram illustrating a multi-storage state nvSRAM device utilizing capacitors as resistive devices.

FIG. 4 is a schematic circuit diagram illustrating a multi-storage state nvSRAM device 400 utilizing capacitors as resistive devices, that is arranged in accordance with at least some embodiments described herein. As illustrated, the nvSRAM device 400 may comprise three non-volatile storage elements formed by transistor-resistive device pairs T1 and C1, T2 and C2, and T3 and C3. As shown, the nvSRAM device 400 may include transistors T0, T1, T2, T3, Tw1 and Tw2, inverters I1 and I2, and resistive devices R0, capacitor C1, capacitor C2, and capacitor C3.

Inverter I1 may include an input terminal coupled to node N2 and an output terminal coupled to node N1. Inverter I2 may include an input terminal coupled to node N2 and an output terminal coupled to node N2.

Transistor T0 may include a first terminal coupled to resistive device R0, a second terminal coupled to node N1, and a control terminal coupled to a common write line WLcom. Transistor T1 may include a first terminal coupled to node N2, a second terminal coupled to resistive device C1, and a control terminal coupled to a first write line WL1. Transistor T2 may include a first terminal coupled to node N2, a second terminal coupled to resistive device C2, and a control terminal coupled to a second write line WL2. Transistor T3 may include a first terminal coupled to node N2, a second terminal coupled to resistive device C3, and a control terminal coupled to a third write line WL3.

Transistor Tw1 may include a first terminal coupled to bit line BL1, a second terminal coupled to node N1, and a control terminal coupled to a write line WL0. Transistor Tw2 may include a first terminal coupled to N2, a second terminal coupled to bit line BL2, and a control terminal coupled to a write line WL0.

Resistive device C1 may be embodied as a capacitor that is coupled in series between transistor T1 and bit line BL2. Resistive device R2 may be embodied as a capacitor that is coupled in series between transistor T2 and bit line BL2. Resistive device R3 may be embodied a capacitor that is coupled in series between transistor T3 and bit line BL2. Resistive device R0 may be coupled between transistor T0 and node N1.

According to some configurations, as an alternate to the use of programmable resistive devices for storage of logic states, capacitors (e.g., capacitors C1, C2 and C3) may be utilized. Since capacitors may leak charge at a certain rate and need to be refreshed, the device may not be of non-volatile type.

During an example operation, to store a logic state in the capacitor (e.g. a logic low state "0" in capacitor C2), the corresponding wordline transistor T2 may be activated by WL2, and capacitor C2 may be charged to voltage Vdd. To restore the state stored in capacitor C2, nodes N1 and N2 may be brought to Vdd/2 by setting bit lines BL1 and BL2 to voltage Vdd/2 and enabling wordline WL0. When wordline WL0 is turned off and then wordline WL2 is enabled, the node N2 may be at a higher voltage if a "1" is stored in capacitor C2 and restored to Vdd. On the other hand, if a "0" is stored in capacitor C2, node N2 may be at a lower voltage than node N1 due to the extra capacitance and reset to ground, thereby restoring the SRAM cell to a "0" state.

In some examples, an equalization circuit may be utilized in the nvSRAM device 400. The equalization circuit may comprise an equalization transistor Te that is placed between node N1 and node N2. To restore a state stored in a capacitor (e.g. capacitor C2), the equalization transistor Te may be turned on by enabling the write enable signal WE. This may equalize the voltages at node N1 and N2. Transistor Te may be turned off and then WL2 may be enabled, and the node N2 may be at a higher voltage if a "1" is stored in capacitor C2 and restored to Vdd. On the other hand, if a "0" is stored in capacitor C2, node N2 may be at a lower voltage than node N1 due to the extra capacitance and reset to ground, thereby restoring the SRAM to a "0" state.

According to some configurations, one or more programmable resistors may be embodied as an antifuse. An antifuse may include a thin oxide capacitor or an amorphous Si resistor and have an effective resistance value in the giga ohm range or more. In response to applying a voltage that exceeds the breakdown voltage of the oxide, the oxide may break down and the resulting resistance value is much reduced, e.g. to 10-100 s of ohms. This type of resistor may be typically programmed only once.

Because of the high voltage to break down an antifuse, an antifuse procedure may be used to program antifuses. According to some examples, the following antifuse procedure may be utilized. In FIG. 4, assume that resistive device R0 is a fixed value resistor, e.g. 1 k ohms, resistive devices C1, C2, and C3 are antifuses, which are normally in the open, HRS, state. To program the capacitor C2, e.g., break the capacitor C2 so that it turns into a LRS, without affecting capacitors C1 and C3, capacitor C1 and C3 may be charged to an intermediate voltage Vm, e.g. charged to the supply voltage Vdd. This may result in the capacitors C1 and C3 to be at approximately voltage Vdd. The SRAM cell is then programmed to a "0" state, with node N2 at ground. Write line WL2 is then enabled to activate transistor T2 which will bring the capacitor C2 to ground as well. Bit line BL2 may be ramped to a high voltage Vpp that is sufficient to breakdown capacitor C2. Since the voltage across capacitors C1 and C2 is less, approximately at voltage Vpp-Vm, these antifuses may be safe from breaking and may remain at HRS.

Figure 5:
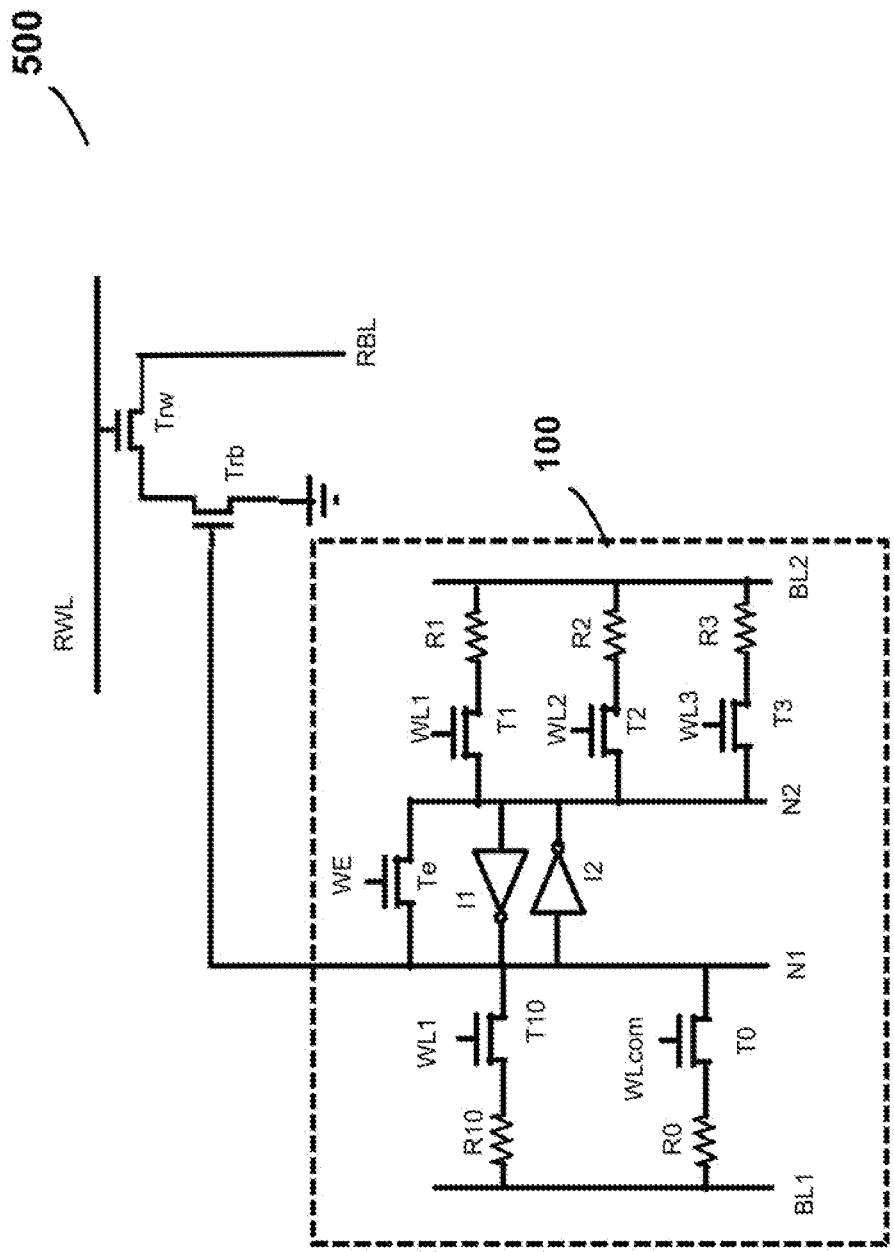
FIG. 5 is a schematic circuit diagram illustrating an example multi-storage state nvSRAM device for use in low voltage operation.

FIG. 5 is a schematic circuit diagram illustrating an example multi-storage state nvSRAM device 500 for use in low voltage operation that is arranged in accordance with at least some embodiments described herein. As illustrated, the nvSRAM device 500 may include the nvSRAM device 100 such as previously described, a transistor Trb, and a transistor Trw.

Transistor Trb may include a first terminal coupled to a terminal of transistor Trw, a second terminal coupled to ground, and a control terminal coupled to node N1. Transistor Trw may include a first terminal coupled to a read bit line RBL, a second terminal coupled to the first terminal of transistor Trw, and a control terminal coupled to a read write line RWL. According to some configurations, the two transistors Trw and Trb may be used to read the logic state of the SRAM cell with less disturbance to an SRAM cell itself.

Figure 6:
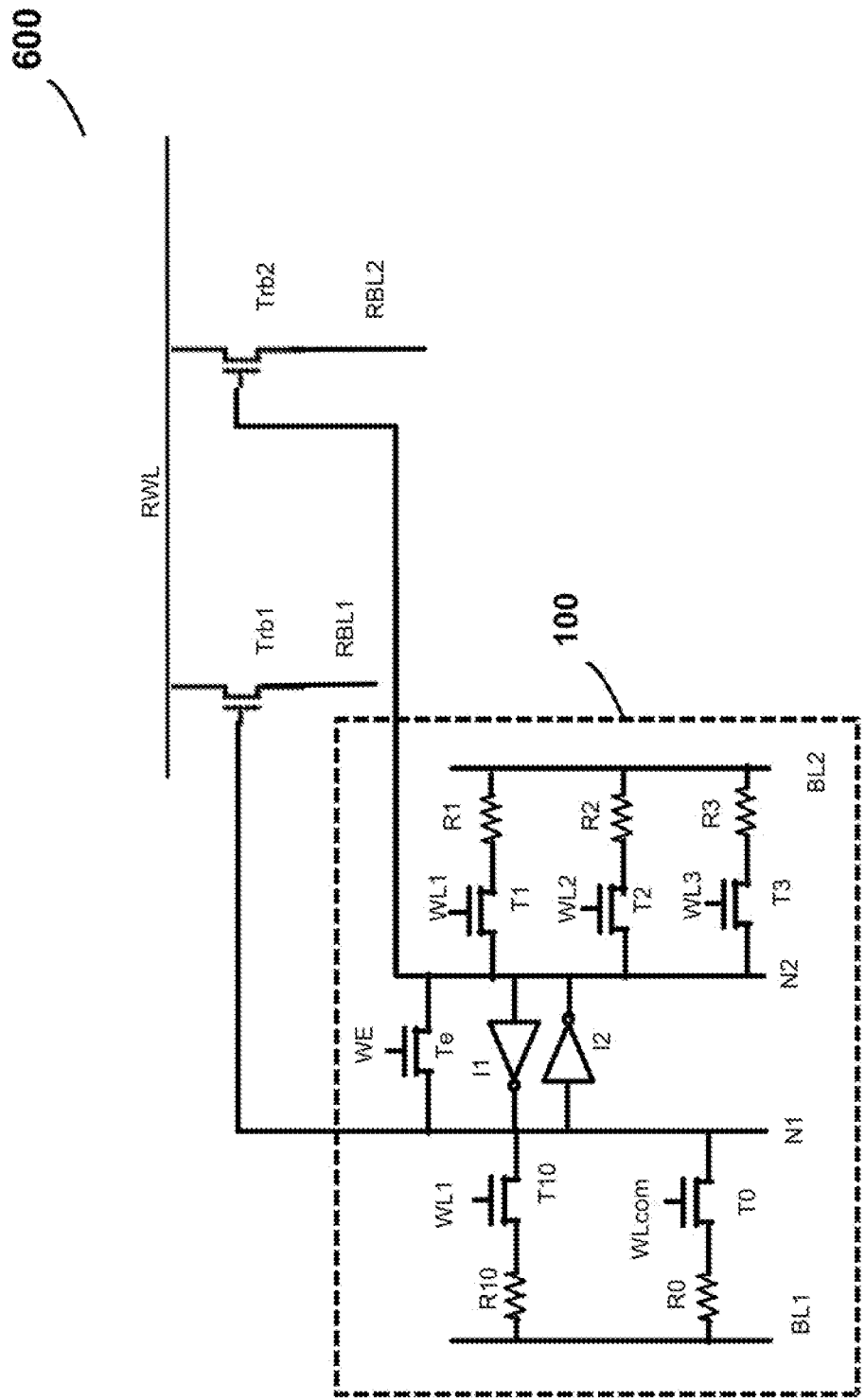
FIG. 6 is a schematic circuit diagram illustrating an example multi-storage state nvSRAM device including read transistors.

FIG. 6 is a schematic circuit diagram illustrating an example multi-storage state nvSRAM device 600 including read transistors that is arranged in accordance with at least some embodiments described herein. As illustrated, the nvSRAM device 600 may include the nvSRAM device 100 as previously described, a transistor Trb1 and a transistor Trb2.

In FIG. 6, an alternate set of read transistors are added to the SRAM cell. Transistor Trb1 may include a first terminal coupled to a read write line RWL, a second terminal coupled to a read bit line RBL1, and a control terminal coupled to node N1. Transistor Trb2 may include a first terminal coupled to the read write line RWL, a second terminal coupled to a read bit line RBL2, and a control terminal coupled to node N2. When the read word line (RWL) is enabled, the logic state of read bit lines RBL1 and RBL2 may take the logic state of node N1 and node N2, respectively. Read bit line RBL2 may normally be the inverted signal of RBL1. The circuits outside the dashed box 100 may be used to read the logic state of the SRAM cell with less disturbance to the SRAM cell itself. This method can be applied to all the SRAM cells disclosed in this application.

Figure 7:
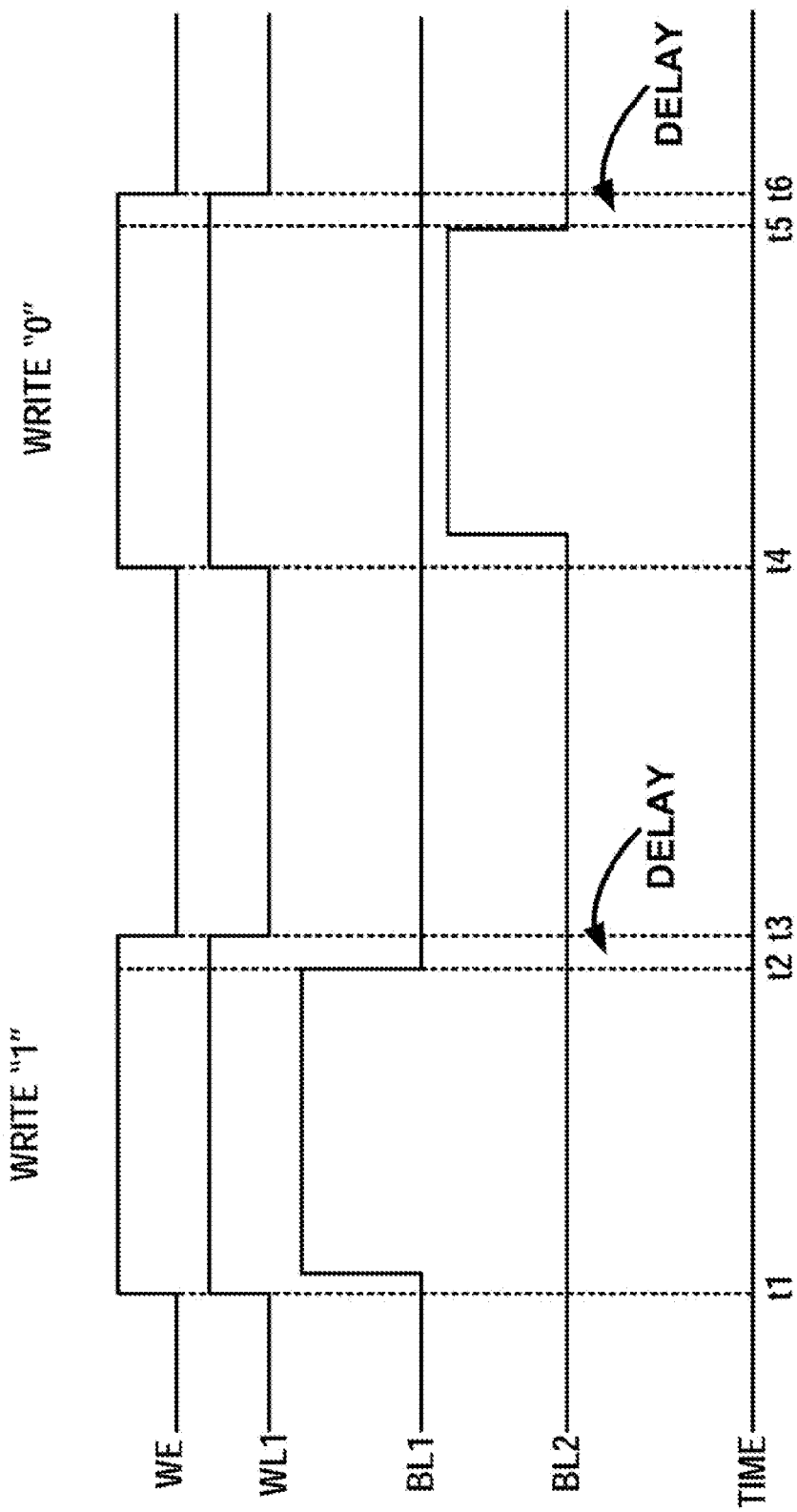
FIG. 7 is a signal timing diagram showing an example write operation for an nvSRAM device.

FIG. 7 is a signal timing diagram showing an example write operation, such as for the first memory cell of the nvSRAM device 100 of FIG. 1, arranged in accordance with at least some embodiments presented herein. In FIG. 7, the example signals may include the write enable line WE, the first write line WL1 for the storage circuit 101A, the first bit line BL1, and the second bit line BL2. To write a logic high, or a logical "1," into the storage circuit 101A, at time t1, the write enable line WE and the first write line WL1 may be asserted (e.g., a logic high level or logic 1 level such as Vdd). The first bit line BL1 may be brought to a voltage higher than the high supply voltage (e.g., voltage Vpp), while the second bit line BL2 may be maintained at a low supply voltage (e.g., voltage Vss), or ground.

Transistors T10 and T1 may be activated in response to the asserted the first write line WL1, transistor Te may be activated in response to the asserted write enable line WE, and a conduction path may be formed between the first bit line BL1 to the second bit line BL2 through the first programmable resistive device R10, the transistor T10, transistor Te, the second transistor T1, and the second programmable resistive device R1. In some configurations, the first bit line BL1 may be brought to the voltage at a different time than when the write enable line WE and the first write line WL1 are asserted. In some examples, a delay may be inserted to help ensure that transistors are fully activated and/or deactivated.

To finalize the programming of the first programmable resistive device R10 and the second programmable resistive device R1, at time t2, the first bit line BL may be brought to a low level, such as a low power supply level (e.g., voltage Vss)

or ground. Either simultaneously or at a time proximate to the time at which the first bit line BL is brought to the low level, such as time t3, the write enable line WE and the first write line WL1 may be de-asserted (e.g., brought to a low power supply level or ground).

In some configurations, a time delay may be inserted between the time at which the first bit line BL is brought to a low level and the time at which the write enable line WE and the first write line WL1 are brought to a low level. The time delay may be used to increase the probability that the logic high was written onto the storage circuits (e.g., resistive device R10 and R1). The write enable line WE and the first write line WL1 may be maintained at the high level for a certain duration of time. In some implementations, the pulse width of the write enable line WE and the first write line WL1 may be from approximately 5 nanoseconds to approximately 50 nanoseconds, for example.

To write a logic LOW, or logical "0," to the storage circuit R10 and R0, at time t4, the write enable line WE and the first write line WL1 may be asserted (e.g., brought to a high level such as Vdd, Logic "1" or logic high). When the second bit line BL2 is brought to a high voltage level, current may flow from the second bit line BL2 to the first bit line BL1 through a current path from the second bit line BL2, the second programmable resistive device R1, the transistor T1, the transistor T10, the first programmable resistive device R10 and to the first bit line BL1. This direction of current flow may cause the second programmable resistive device R1 to be programmed to a parallel configuration and the first programmable resistive device R10 to be programmed to an antiparallel configuration.

To finalize the programming of the first programmable resistive device R10 and the second programmable resistive device R0, at time t5, the second bit line BL2 may be brought to a low level, such as ground. Either simultaneously or at a time proximate to the time to which the second bit line BL2 is brought to a low level, such as time t6, the write enable line WE and the first write line WL1 may be de-asserted (e.g., brought to a low level, typically ground). In some configurations, a time delay may be inserted between the time at which the second bit line BLN is brought to a low level and the time at which the write enable line WE and the first write line WL1 are brought to a low level. The time delay may be used to increase the probability that the logic low has been successfully written.

Figure 8:
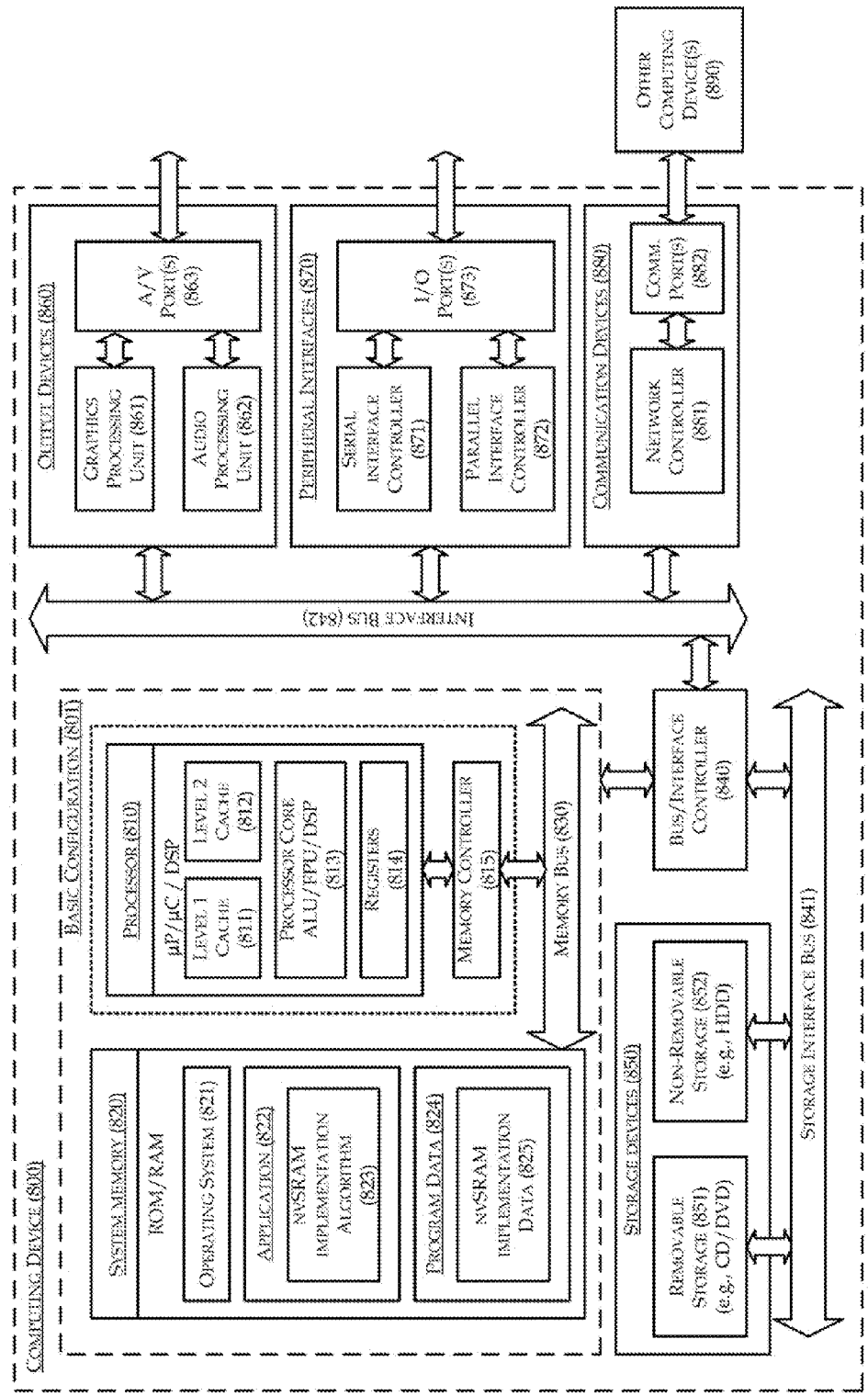
FIG. 8 is a block diagram illustrating an example computing device that is arranged to implement an nvSRAM, all arranged according to at least some embodiments presented herein.

FIG. 8 is a block diagram illustrating an example computing device 800 that is arranged to implement an nvSRAM arranged in accordance with at least some embodiments described herein. In a very basic configuration 801, computing device 800 typically includes one or more processors 810 and system memory 820. A memory bus 830 can be used for communicating between the processor 810 and the system memory 820.

Depending on the desired configuration, processor 810 can be of any type including but not limited to a microprocessor (μR), a microcontroller (μC), a digital signal processor (DSP), or any combination thereof. Processor 810 can include one more levels of caching, such as a level one cache 811 and a level two cache 812, a processor core 813, and registers 814. The processor core 813 can include an arithmetic logic unit (ALU), a floating point unit (FPU), a digital signal processing core (DSP core), or any combination thereof. A memory controller 815 can also be used with the processor 810, or in some implementations the memory controller 815 can be an internal part of the processor 810.

Depending on the desired configuration, the system memory 820 can be of any type including but not limited to volatile memory (such as RAM), non-volatile memory (such as ROM, flash memory, etc.) or any combination thereof. System memory 820 typically includes an operating system 821, one or more applications 822, and program data 824. Application 822 includes an nvSRAM implementation algorithm 823 that is arranged to implement or operate an nvSRAM. Program Data 824 includes nvSRAM implementation data 825 that is useful for implementing or operating an nvSRAM. In some embodiments, application 822 can be arranged to operate with program data 824 on an operating system 821 such that various components of the computing device can implement or operate an nvSRAM. This described basic configuration is illustrated in FIG. 8 by those components within dashed line 801.

Computing device 800 can have additional features or functionality, and additional interfaces to facilitate communications between the basic configuration 801 and any required devices and interfaces. For example, a bus/interface controller 840 can be used to facilitate communications between the basic configuration 801 and one or more data storage devices 850 via a storage interface bus 841. The data storage devices 850 can be removable storage devices 851, non-removable storage devices 852, or a combination thereof. Examples of removable storage and non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media can include volatile and nonvolatile, removable and non-removable media implemented in any method or technology for storage of information, such as computer readable instructions, data structures, program modules, or other data.

System memory 820, removable storage devices 851 and non-removable storage devices 852 are all examples of computer storage media. Computer storage media includes, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which can be used to store the desired information and which can be accessed by computing device 800. Any such computer storage media can be part of computing device 800.

Computing device 800 can also include an interface bus 842 for facilitating communication from various interface devices (e.g., output interfaces, peripheral interfaces, and communication interfaces) to the basic configuration 801 via the bus/interface controller 840. Example output devices 860 include a graphics processing unit 861 and an audio processing unit 862, which can be configured to communicate to various external devices such as a display or speakers via one or more A/V ports 863. Example peripheral interfaces 870 include a serial interface controller 871 or a parallel interface controller 872, which can be configured to communicate with external devices such as input devices (e.g., keyboard, mouse, pen, voice input device, touch input device, etc.) or other peripheral devices (e.g., printer, scanner, etc.) via one or more I/O ports 873. An example communication device 880 includes a network controller 881, which can be arranged to facilitate communications with one or more other computing devices 890 over a network communication via one or more communication ports 882. The communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, communication media can include wired media such as a wired network or direct-wired connection, and wireless media such as acoustic, radio frequency (RF), infrared (IR) and other wireless media. The term computer readable media as used herein can include both storage media and communication media.

Computing device 800 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 800 can also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, compounds, or compositions, which can, of course, vary. It is also to be understood that the terminology used herein is for the purpose of describing particular embodiments only, and is not intended to be limiting.

For example, the series positions of the resistor-transistor pairs in one or more of the figures or in other configurations might be "swapped" in some embodiments, such that the resistor may be placed to the "right" or to the "left" of the corresponding transistor. Still in other embodiments, the internal resistance of a transistor may be used to provide the functionality of a discrete resistive device in the various configurations. Other possible implementations for a resistive device may include polysilicon resistors, diffusion resistors, carbon metal file resistors, ceramic resistors, transformers biased as a resistor, or other device(s) having resistive material.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations.

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include, but not be limited to, systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

Further, the use of the terms "first," "second," "third," "fourth," and the like is to distinguish between repeated instances of a component or a step in a process and does not impose a serial or temporal limitations unless specifically stated to require such serial or temporal order.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," or the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A multi-bit non-volatile random access memory device, comprising:
    a first node;
    a first multi-bit storage circuit that includes a first transistor and a first programmable resistive device, a first terminal of the first transistor coupled to a second node, a control terminal of the first transistor coupled to a first write line, and a second terminal of the first transistor coupled to a third node, the first programmable resistive device coupled between the third node and a first bit line;
    a second multi-bit storage circuit that includes a second transistor and a second programmable resistive device, a first terminal of the second transistor coupled to the second node, a control terminal of the second transistor coupled to a second write line, and a second terminal of the second transistor coupled to a fourth node, the second programmable resistive device coupled between the fourth node and the first bit line;
    a reference circuit that includes a third transistor, a first terminal of the third transistor coupled to a second bit line and a second terminal of the third transistor coupled to the first node, and a control terminal of the third transistor coupled to a common write line; and
    a write enable circuit that includes a fourth transistor having a first terminal coupled to the first node, a second terminal coupled to the second node, and a control terminal coupled to a write enable line, wherein the write enable circuit is configured to activate in response to a write enable signal on the write enable line such that current flows either from the first bit line to the second bit line, or from the second bit line to the first bit line, to store a logic high state or a logic low state in one or more of the first multi-bit storage circuit or the second multi-bit storage circuit.

2. The multi-bit non-volatile random access memory device of claim 1, wherein the reference circuit further comprises a common resistor, the common resistor coupled between the second bit line and the first terminal of the third transistor.

3. The multi-bit non-volatile random access memory device of claim 2, wherein the first programmable resistive device comprises a magnetic tunnel junction device and the second programmable resistive device comprises a magnetic tunnel junction device.

4. The multi-bit non-volatile random access memory device of claim 2, wherein a resistive state of the first programmable resistive device and a resistive state of the second programmable resistive device are dynamically configured in response to a direction of current flow through the first programmable resistive device and the second programmable resistive device.

5. The multi-bit non-volatile random access memory device of claim 2, wherein the common resistor has a fixed resistance value between a low resistance state (LRS) and a high resistance state (HRS).

6. The multi-bit non-volatile random access memory device of claim 1, wherein the write enable circuit further comprises a sense circuit coupled between the first node and the second node, the sense circuit including cross coupled inverter devices.

7. The multi-bit non-volatile random access memory device of claim 1, wherein the first programmable resistive device and the second programmable resistive device are one or more of a magnetic tunnel junction resistor, a conductive-bridge resistor, a metal-oxide bipolar filament resistor, a metal-oxide bipolar interface effect resistor, or an amorphous silicon switching medium resistor.

8. The multi-bit non-volatile random access memory device of claim 1, wherein the logic high state or the logic low state corresponds to a relative resistance value between one or more of the first programmable resistive device or the second programmable resistive device and the reference circuit.

9. The multi-bit non-volatile random access memory device of claim 1, wherein the first transistor and the second transistor are configured to activate in response to assertion of one or more signals on one or more of the first write line or the second write line.

10. The multi-bit non-volatile random access memory device of claim 1, wherein one or more of the first programmable resistive device or the second programmable resistive device are programmable to at least two resistance states that include a low resistance state (LRS) and a high resistance state (HRS).

11. The multi-bit non-volatile random access memory device of claim 1, further comprising a read bit line transistor coupled to a read word line transistor, a control terminal of the read bit line transistor coupled to the first node, and a control terminal of the read word line transistor coupled to receive a read word line enable signal, wherein a state of at least one of the first multi-bit storage circuit or the second multi-bit storage circuit is read by enablement of the read word line transistor.

12. The multi-bit non-volatile random access memory device of claim 1, wherein one or more of the first programmable resistive device and the second programmable resistive device include capacitors.

13. A multi-bit non-volatile static random access memory device, comprising:
    a write enable circuit coupled to a first node and a second node, an input terminal of the write enable circuit coupled a write enable line;
    a common resistive circuit coupled to a first bit line and to the first node; and
    a plurality of multi-bit storage circuits, each of the plurality of the multi-bit storage circuits comprising:
        a first transistor that includes a first terminal coupled to the second node, a second terminal coupled to a first programmable resistive device, and
        a control terminal coupled to a write line,
        the first programmable resistive device coupled between the second terminal and a second bit line,
        wherein a relative resistance value between the first programmable resistive device and the common resistive circuit represents a value of a binary bit stored by one or more of the multi-bit storage circuits.

14. The multi-bit non-volatile static random access memory device of claim 13, wherein the write enable circuit comprises a cross coupled inverter circuit pair, wherein an output terminal of a first inverter circuit of the pair is coupled to an input terminal of a second inverter circuit of the pair and an input of the first inversion circuit is coupled to an output of the second inverter circuit.

15. The multi-bit non-volatile static random access memory device of claim 14, wherein the write enable circuit further comprises a second transistor, a first terminal of the second transistor coupled to an input terminal of the first inversion circuit, a second terminal of the second transistor coupled to the input terminal of the second inversion circuit, and a control terminal of the write enable circuit coupled to the write enable line, wherein the second transistor is configured to activate in response to assertion of a write enable signal.

16. The multi-bit non-volatile static random access memory device of claim 15, wherein the common resistive circuit comprises a third transistor, a first terminal of the third transistor coupled to the first bit line, a second terminal of the third transistor coupled to the first node, and a control terminal coupled to the write enable line.

17. The multi-bit non-volatile static random access memory device of claim 16, wherein the common resistive circuit further comprises a common resistor that is coupled between the first bit line and the first terminal of the third transistor.

18. The multi-bit non-volatile static random access memory device of claim 13, wherein the first programmable resistive device is selected from a group comprising a magnetic tunnel junction resistor, a conductive-bridge resistor, a metal-oxide bipolar filament resistor, a metal-oxide bipolar interface effect resistor, or an amorphous silicon switching medium resistor.

19. The multi-bit non-volatile static random access memory device of claim 13, wherein a resistive state of the first programmable resistive device is dynamically configurable in response to a direction of current flow through the first programmable resistive device.

20. The multi-bit non-volatile static random access memory device of claim 13, wherein the value of the binary bit corresponds to a relative resistance value between the first programmable resistive device and the common resistive circuit.

21. The multi-bit non-volatile static random access memory device of claim 13, wherein the first programmable resistive device includes a capacitor.

22. A multi-bit non-volatile random access memory device, comprising:
   a cross coupled inverter pair coupled between a first node and a second node;
   a first series transistor-resistor pair that includes a first transistor coupled in series with a first resistive device, the first series transistor-resistor pair coupled between the first node and a first bit line, a control terminal of the first transistor coupled to a first word line;
   a second series transistor-resistor pair that includes a second transistor coupled in series with a second resistive device, the second series transistor-resistor pair coupled between the second node and a second bit line, a control terminal of the second transistor coupled to a second word line;
   a write circuit that includes a third transistor coupled between the first node and the first bit line and a fourth transistor coupled between the second node and the second bit line, control terminals of the third transistor and the fourth transistor coupled to a write enable word line; and
   wherein the write circuit is configured to activate to write a logic state to the memory device, wherein the logic state is represented by a differential resistance between the first series transistor-resistor pair and the second series transistor-resistor pair.

23. The multi-bit non-volatile random access memory device of claim 22, further comprising a fifth transistor coupled between the first node and the second node, a control terminal of the fifth transistor coupled to a supply voltage.

24. The multi-bit non-volatile random access memory device of claim 22, wherein one or more of the first and second resistive devices include programmable resistors or programmable non-volatile memory transistors that each can be programmable to at least two resistance states: a low resistance state (LRS) and a high resistance state (HRS).

25. The multi-bit non-volatile random access memory device of claim 24, wherein the first resistor has a fixed resistance value between that of the LRS and that of the HRS.

26. The multi-bit non-volatile random access memory device of claim 22, wherein the second resistor in the second transistor-resistor pair includes an antifuse.

27. A method to program the multi-bit non-volatile random access memory device of claim 26, wherein the random access memory device includes a static random access memory device (SRAM) with plural ones of the antifuse, the method comprising:
   writing data into the SRAM device to set the second node to a low voltage state;
   activating a wordline transistor of a selected antifuse; and
   asserting the programming voltage to the second bit line to cause the selected antifuse to breakdown in a manner that reduces a resistance value of the selected antifuse.

28. A method to operate a multi-bit non-volatile random access memory device, the method comprising:
   asserting a first signal to a first transistor to enable a current path between a first terminal of a first transistor and a first terminal of a second transistor,
   asserting a second signal to the first transistor and the second transistor to activate the first transistor and the second transistor, and
   asserting a voltage to a first bit line to cause current flow from the first bit line through a first programmable resistive device, the first transistor, the second transistor, a second resistive device and out to a second bit line to store a first logic state, or, asserting a voltage to the second bit line to cause current flow from the second bit line through the second resistive device, the second transistor, the first transistor, the first programmable resistive device and out to the first bit line to store a second logic state.

29. The method of claim 28, further comprising
   deasserting the first signal,
   deasserting the second signal, and
   deasserting the first bit line or the second bit line.

30. The method of claim 28, wherein the first logic state corresponds to a high resistance state of the first programmable resistive device, and wherein the second logic state corresponds to a low resistance state of the first programmable resistive device.

31. A multi-bit non-volatile static random access memory device, comprising:
   a cross coupled inverter pair coupled between a first node and a second node;
   a plurality of first transistor-resistor pairs coupled in series between the first node and a third node and coupled to a respective first word line, wherein the third node is configured to be coupled to a supply line through an enable transistor;
   a plurality of second transistor-resistor pairs coupled in series between the second node and the third node and coupled to a respective second word line; and
   a first write transistor coupled between the first node and a first bitline, and including a control terminal coupled to a write enable word line;
   a second write transistor coupled between the second node and a second bitline, and including a second control terminal coupled to the write enable word line;
   wherein one or more of the first write transistor or the second write transistor are configured to be activated to write a logic state to the memory device, the logic state represented by a differential resistance between at least one of the first series coupled transistor-resistor pairs and at least one of the second series coupled transistor-resistor pairs.

32. The device of claim 31, wherein at least a portion of the resistors in the first transistor-resistor pairs and the second first transistor-resistor pairs include one or more programmable resistors that are configured to be programmable to at least two resistance states including a low resistance state (LRS) and a high resistance state (HRS), the programmable resistors comprising programmable one or more of a magnetic tunnel junction resistor, a conductive-bridge resistor, a metal-oxide bipolar filament resistor, a metal-oxide bipolar interface effect resistor, or an amorphous silicon switching medium resistor.

33. The device of claim 31, wherein at least one of the resistors in the plurality of the first transistor-resistor pairs has a fixed resistance value between a low resistance state (LRS) and a high resistance state (HRS).

* * * * *